(12) United States Patent
Goktepeli et al.

(10) Patent No.: US 9,837,302 B1
(45) Date of Patent: Dec. 5, 2017

(54) METHODS OF FORMING A DEVICE HAVING SEMICONDUCTOR DEVICES ON TWO SIDES OF A BURIED DIELECTRIC LAYER

(71) Applicant: QUALCOMM Incorporated, San Diego, CA (US)

(72) Inventors: Sinan Goktepeli, San Diego, CA (US); Stephen Alan Fanelli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/249,112

(22) Filed: Aug. 26, 2016

(51) Int. Cl.
| | |
|---|---|
| H01L 49/02 | (2006.01) |
| H01L 23/66 | (2006.01) |
| H01L 21/762 | (2006.01) |
| H01L 21/84 | (2006.01) |
| H01L 27/12 | (2006.01) |
| H04W 88/00 | (2009.01) |

(52) U.S. Cl.
CPC ........ *H01L 21/76256* (2013.01); *H01L 21/84* (2013.01); *H01L 27/1203* (2013.01); *H04W 88/005* (2013.01)

(58) Field of Classification Search
None
See application file for complete search history.

(56) References Cited

U.S. PATENT DOCUMENTS

| | | | |
|---|---|---|---|
| 6,583,030 B1 | 6/2003 | Grassl | |
| 7,354,809 B2 | 4/2008 | Yuan et al. | |
| 7,462,509 B2 | 12/2008 | Bernstein et al. | |
| 2007/0286136 A1 | 12/2007 | Rittle et al. | |
| 2015/0348945 A1* | 12/2015 | Or-Bach | H01L 21/743 257/384 |
| 2016/0027704 A1 | 1/2016 | Lee | |
| 2016/0093750 A1 | 3/2016 | Kim et al. | |
| 2016/0211184 A1* | 7/2016 | Previtali | H01L 21/823871 |

\* cited by examiner

*Primary Examiner* — Asok K Sarkar
(74) *Attorney, Agent, or Firm* — Toler Law Group, PC

(57) ABSTRACT

A method includes performing an etching process from a second side of a buried dielectric layer to expose an etch stop layer, where the second side of the buried dielectric layer is opposite a first side of the buried dielectric layer, and where a first semiconductor device is positioned on the first side of the buried dielectric layer. The method further includes forming a second semiconductor device on the second side of the buried dielectric layer.

25 Claims, 19 Drawing Sheets

1600

1602

Perform an etching process from a second side of a buried dielectric layer to expose an etch stop layer, where the second side of the buried dielectric layer is opposite a first side of the buried dielectric layer, and where a first semiconductor device is positioned on the first side of the buried dielectric layer

1604

Form a second semiconductor device on the second side of the buried dielectric layer

1702
Perform a thinning process from a second side of a buried dielectric layer to expose an etch enhancement layer, where the second side of the buried dielectric layer is opposite a first side of the buried dielectric layer, and where a first semiconductor device is positioned on the first side of the buried dielectric layer 1704
Perform an etching process to remove the etch enhancement layer 1706
Form a second semiconductor device on the second side of the buried dielectric layer

*FIG. 17*

METHODS OF FORMING A DEVICE HAVING SEMICONDUCTOR DEVICES ON TWO SIDES OF A BURIED DIELECTRIC LAYER

I. FIELD

The present disclosure is generally related to methods of forming a device having semiconductor devices on two sides of a buried oxide layer.

II. DESCRIPTION OF RELATED ART

Complementary metal-oxide semiconductor (CMOS) processes may be used to form electronic devices, such as transistors, on a buried oxide (BOX) layer. However, some CMOS processes may enable formation of the devices on only one side of the buried metal oxide. To reduce area occupied by devices, some CMOS processes may enable forming devices on both sides of the BOX layer. For example, after semiconductor devices are formed on one side of a BOX layer, hydrogen may be implanted from that side of the BOX layer, the BOX layer may be "flipped over," and a hydrogen layer (formed due to the hydrogen implantation) may be cleaved prior to formation of semiconductor devices on the other side of the BOX layer. However, hydrogen implantation may increase manufacturing complexity and/or cost.

III. SUMMARY

A first method includes performing an etching process from a second side of a buried dielectric layer (e.g., a buried oxide (BOX) layer) to expose an etch stop layer, where the second side of the buried dielectric layer is opposite a first side of the buried dielectric layer, and where a first semiconductor device is positioned on the first side of the buried dielectric layer. The first method further includes forming a second semiconductor device on the second side of the buried dielectric layer.

A second method includes performing a thinning process from a second side of a buried dielectric layer (e.g., a BOX layer) to expose an etch enhancement layer, where the second side of the buried dielectric layer is opposite a first side of the buried dielectric layer, and where a first semiconductor device is positioned on the first side of the buried dielectric layer. The second method further includes performing an etching process to remove the etch enhancement layer. The second method further includes forming a second semiconductor device on the second side of the buried dielectric layer.

An apparatus includes a buried dielectric layer (e.g., a BOX layer) including a first side and a second side opposite the first side. The apparatus further includes a first semiconductor device positioned on the first side and a second semiconductor device positioned on the second side. The second semiconductor device is formed after exposing an etch stop layer using an etching process from the second side of the buried dielectric layer.

An apparatus includes a buried dielectric layer (e.g., a BOX layer) including a first side and a second side opposite the first side. The apparatus further includes a first semiconductor device positioned on the first side and a second semiconductor device positioned on the second side. The second semiconductor device is formed after removing an etch enhancement layer using an etching process from the second side of the buried dielectric layer.

IV. BRIEF DESCRIPTION OF THE DRAWINGS

FIG. 1 is a diagram of a device having semiconductor devices on two sides of a buried dielectric layer;

FIGS. 2, 3, 4, 5, 6, 7, and 8 are diagrams illustrating stages of a first method of fabricating a device having semiconductor devices on two sides of a buried dielectric layer;

FIGS. 9, 10, 11, 12, 13, 14, and 15 are diagrams illustrating stages of a second method of fabricating a device having semiconductor devices on two sides of a buried dielectric layer;

FIG. 16 is a flowchart illustrating the first method of fabricating a device having semiconductor devices on two sides of a buried dielectric layer;

FIG. 17 is a flowchart illustrating the second method of fabricating a device having semiconductor devices on two sides of a buried dielectric layer;

V. DETAILED DESCRIPTION

Figure 1:
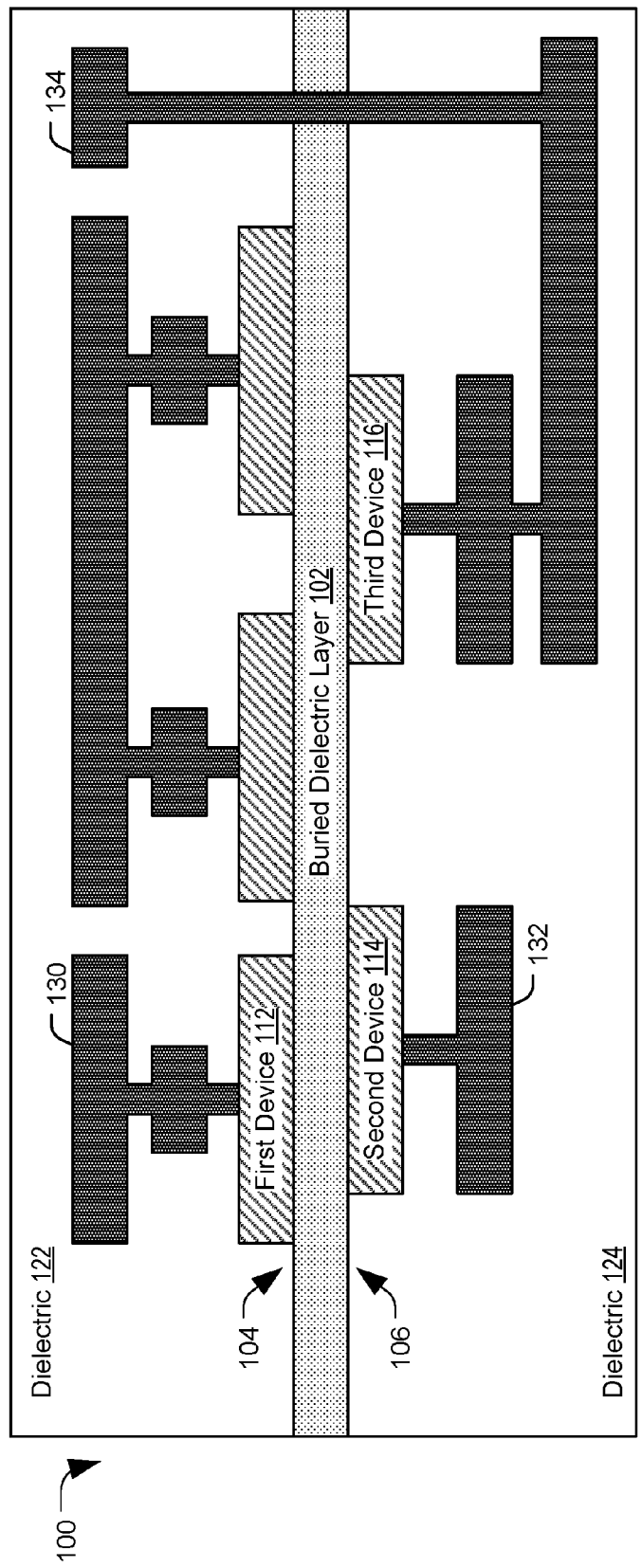

Particular aspects of the present disclosure are described below with reference to the drawings. In the description, common features are designated by common reference numbers throughout the drawings. As used herein, various terminology is used for the purpose of describing particular implementations and is not intended to be limiting. For example, the singular forms "a," "an," and "the" are intended to include the plural forms as well, unless the context clearly indicates otherwise. It may be further understood that the terms "comprises" and "comprising" may be used interchangeably with "includes" or "including." Additionally, it will be understood that the term "wherein" may be used interchangeably with "where." As used herein, "exemplary" may indicate an example, an implementation, or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

The present disclosure presents methods of forming devices on multiple sides of a buried dielectric layer without relying on hydrogen implantation. In some implementations, the buried dielectric layer is a buried oxide (BOX) layer. According to a first method, devices may be formed on a first side of a buried dielectric layer, where the buried dielectric layer is positioned above an etch stop layer. A dielectric layer (e.g., insulator) may be deposited on and around the devices, and a handle may be attached to the dielectric layer (e.g., the handle may be used to manipulate a wafer including the buried dielectric layer during fabrication, such as to flip the wafer over). Next, an etching process may be performed to expose the etch stop layer, where the etching process is performed from a second side of the buried dielectric layer that is opposite the first side. As used herein, an etching process may refer to a wet etching process or to a dry etching process. A planarization process (e.g., chemical mechanical planarization (CMP)) may be performed to remove the etch stop layer, after which devices may be formed on the second side of the buried dielectric layer.

According to a second method, devices may be formed on a first side of a buried dielectric layer, a dielectric layer may be deposited on and around the devices, and a handle may be attached to the dielectric layer. In contrast to the first method described above, the second method may not involve an etch stop layer. Instead, the buried dielectric layer may be positioned above an etch enhancement layer, where the etch enhancement layer is positioned above a substrate. After the wafer is flipped over, a wafer thinning process (e.g., a planarization process, such as CMP, a grinding process, an etching process, such as a wet etch, or a combination thereof) may be performed on the substrate to remove the substrate and to expose the etch enhancement layer. The etch enhancement layer may then be removed using etching, after which devices may be formed on a second side of the buried dielectric layer opposite the first side.

Referring to FIG. 1, a device 100 having semiconductor devices on two sides of a buried dielectric layer is illustrated. The device 100 includes a buried dielectric layer 102, and the buried dielectric layer 102 includes a first side 104 and a second side 106. In some examples, the buried dielectric layer 102 corresponds to a BOX layer. Devices having semiconductor devices on two sides of a buried dielectric layer may further include one or more dielectric layers. For example, the device 100 includes a first dielectric layer 122 and a second dielectric layer 124.

The device 100 includes a first semiconductor device 112 located on the first side 104 of the buried dielectric layer 102. The device 100 further includes a second semiconductor device 114 and a third semiconductor device 116 located on the second side 106 of the buried dielectric layer 102. The first semiconductor device 112, the second semiconductor device 114, and the third semiconductor device 116 may each include a transistor, a capacitor, a diode, a resistor, an inducer, a thyristor, another semiconductor device, or a combination thereof, as illustrative, non-limiting examples. The first semiconductor device 112, the second semiconductor device 114, and the third semiconductor device 116 may each include silicon, silicon-germanium, silicon carbide, gallium arsenide, indium gallium arsenide, indium gallium arsenide phosphide, gallium nitride, another conductive material, or any combination thereof. Semiconductor devices formed on the second side 106 of the buried dielectric layer 102 may be formed after removal of an etch stop layer or an etch enhancement layer without performing hydrogen implantation, as described further with reference to FIGS. 2-17.

Alternatively, semiconductor devices on the first side 104 of the buried dielectric layer 102 may be formed after removal of an etch stop layer or an etch enhancement layer without performing hydrogen implantation, as described further with reference to FIGS. 2-17.

Semiconductor devices of the device 100 may be coupled to conductive metal structures (e.g., contacts, pads, vias, interconnects, etc.) that may enable other devices to be coupled to the semiconductor devices. For example, the first semiconductor device 112 is coupled to a first metal structure 130 and the second semiconductor device 114 is coupled to a second metal structure 132. In particular examples, a metal structure may traverse the buried dielectric layer 102 of the device 100, enabling electrical connections to a semiconductor device from either side of the buried dielectric layer 102. For example, the third semiconductor device 116 is coupled to a third metal structure 134. The third metal structure 134 traverses the buried dielectric layer 102. Thus, the third metal structure 134 may enable electrical connections to the third semiconductor device 116 from either the first side 104 or the second side 106 of the buried dielectric layer 102.

Having devices on both sides (104, 106) of the buried dielectric layer 102 may enhance performance of the device 100 (e.g., by reducing lengths of signaling paths between the devices). Further, the device 100 may have a reduced die area (e.g., because more devices may fit on two sides of a wafer than on one side of the wafer). Thus, in some examples, the device 100 may be suitable for use in electronic devices having small form factors (e.g., embedded devices, mobile communication devices, wearable devices, etc.).

FIGS. 2-8 illustrate examples of stages of a first fabrication process that may be used to fabricate devices, such as the device 100, having semiconductor devices on two sides of a buried dielectric layer. The stages of the first fabrication process are shown as cross-sectional views of formation of the device 100.

Figure 2:
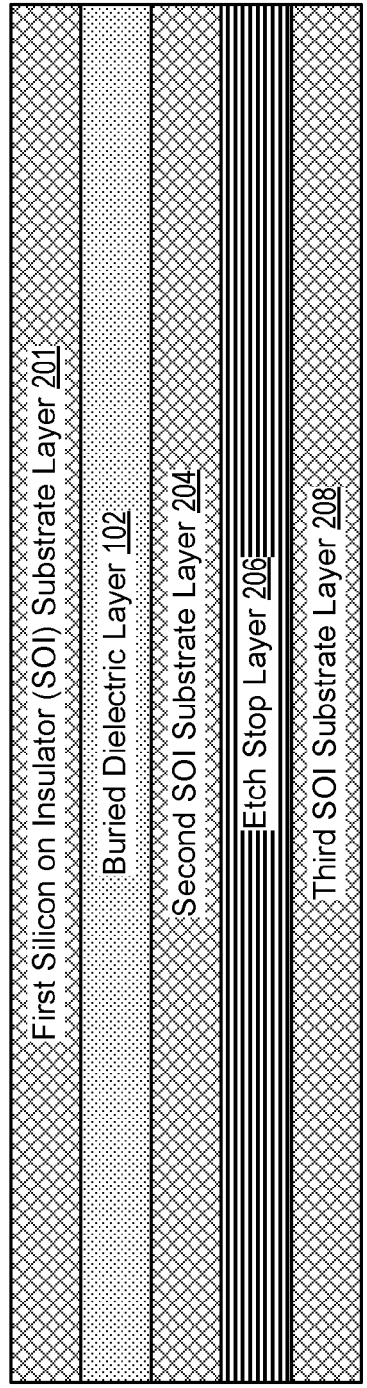

Referring to FIG. 2, a first stage of the first fabrication process is depicted and generally designated 200. FIG. 2 illustrates a first silicon on insulator (SOI) substrate layer 201, the buried dielectric layer 102 of FIG. 1, a second SOI substrate layer 204, an etch stop layer 206, and a third SOI substrate layer 208. The etch stop layer 206 is positioned between the second SOI substrate layer 204 and the third SOI substrate layer 208, and the buried dielectric layer 102 is positioned between the second SOI substrate layer 204 and the first SOI substrate layer 201. The first SOI substrate layer 201, the buried dielectric layer 102 of FIG. 1, the second SOI substrate layer 204, the etch stop layer 206, and the third SOI substrate layer 208 may be included in a wafer, a die, or another chip or device upon which semiconductor fabrication may be performed. In particular implementations, the etch stop layer 206 may be formed in the wafer using an ion implantation process, an epitaxial growth process, or a deposition process.

Figure 3:
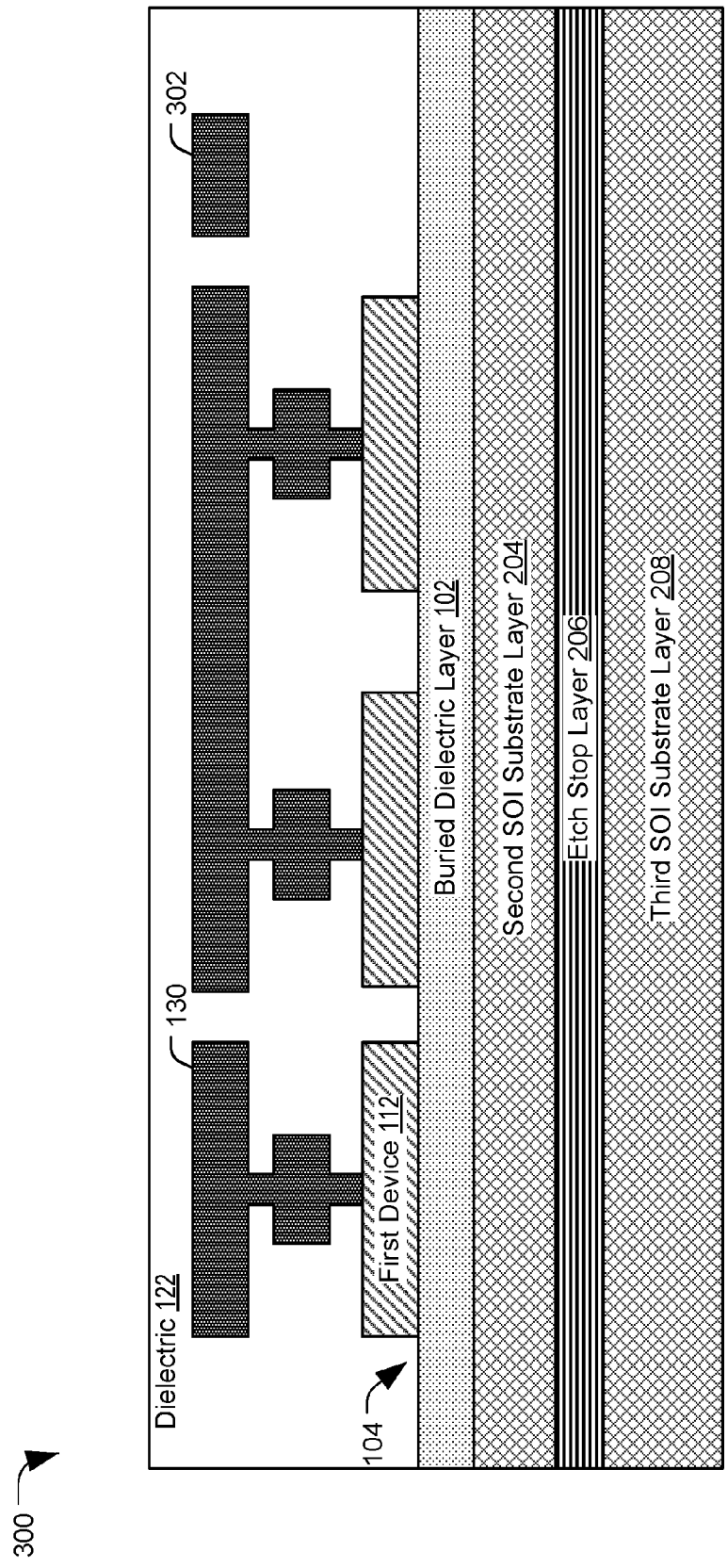

Referring to FIG. 3, a second stage of the first fabrication process is depicted and generally designated 300. The second stage 300 may follow the first stage 200. FIG. 3 illustrates the first semiconductor device 112 on the first side 104 of the buried dielectric layer 102. The first semiconductor device 112 may be formed, for example, by one or more semiconductor manufacturing processes. For example, one or more etching processes, doping processes, planarization processes, deposition processes, epitaxial growth processes, etc. may be applied to the first SOI substrate layer 201 (and any additional layers formed on the first SOI substrate layer 201) to form the first semiconductor device 112 and to remove the first SOI substrate layer 201. FIG. 3 further illustrates the first dielectric layer 122, the first metal structure 130, and a first portion 302 of the third metal structure 134. For example, the first dielectric layer 122 may be formed using a deposition process (e.g., a physical vapor deposition process). In an illustrative example, one or more cavities may be formed in the first dielectric layer 122 (e.g., using an etching process) and the first metal structure 130 and the first portion 302 of the third metal structure 134 may be formed in the one or more cavities (e.g., using one or more deposition processes).

Figure 4:
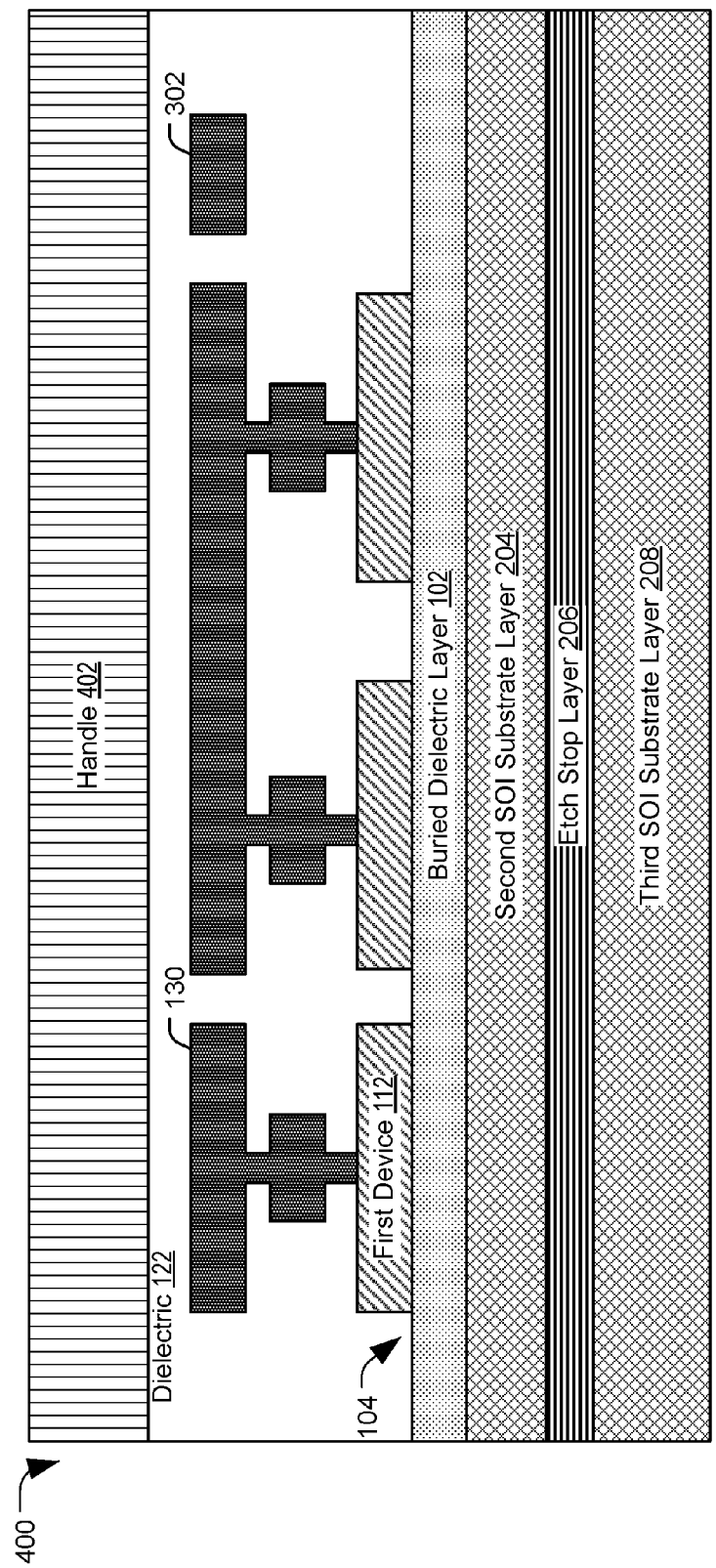

Referring to FIG. 4, a third stage of the first fabrication process is depicted and generally designated 400. The third stage 400 may follow the second stage 300. FIG. 4 illustrates a handle 402 attached (e.g., physically and/or chemically) bonded to the first dielectric layer 122. In a particular example, the handle 402 may correspond to another wafer and may include one or more semiconductor devices, one or more passive devices, one or more micro-electro-mechanical systems (MEMS) devices, one or more electromagnetic devices, another type of device, or a combination thereof, as illustrative, non-limiting examples. In some implementations, the handle 402 includes silicon, glass, gallium arsenide, sapphire, or a combination thereof. The handle 402 may be bonded to the first dielectric layer 122 using a transfer process, in an illustrative example.

Figure 5:
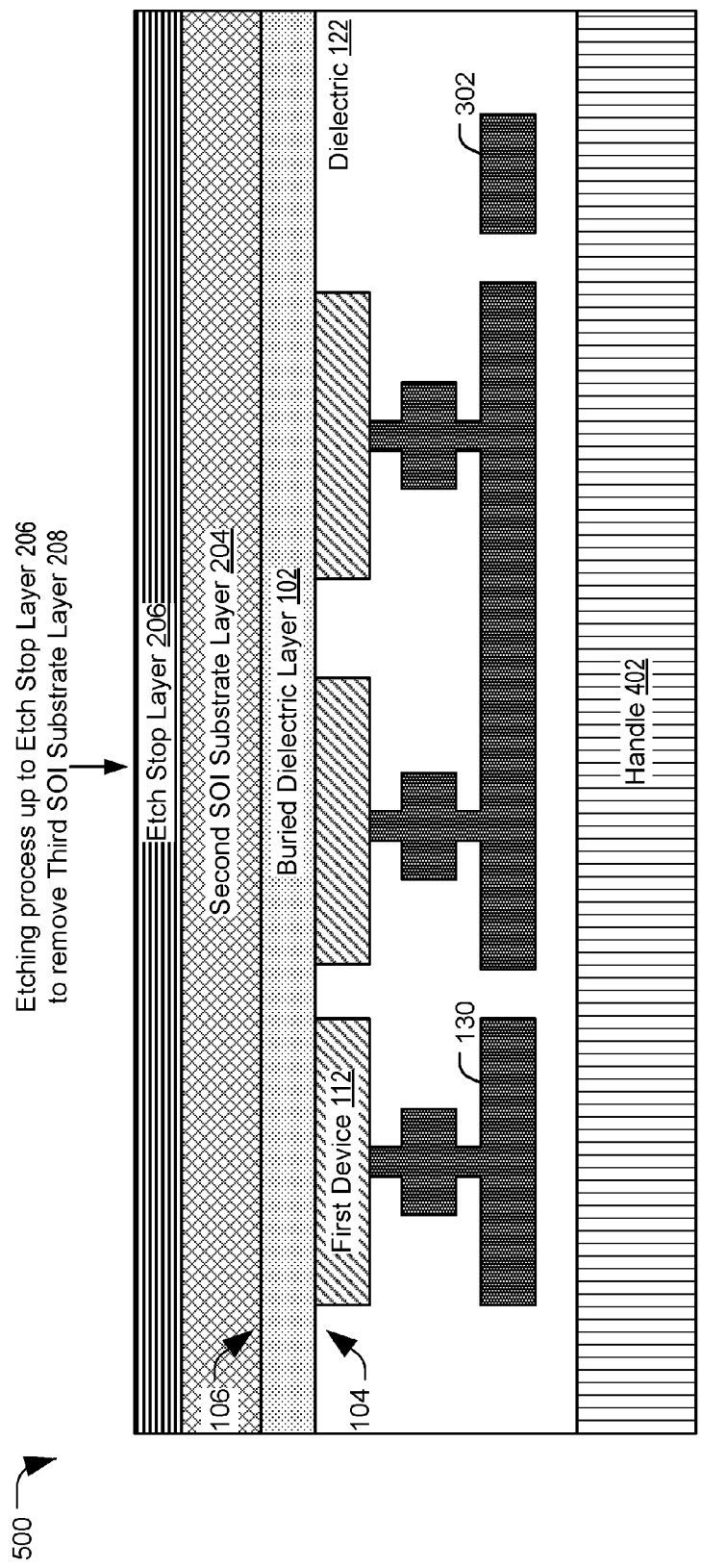

Referring to FIG. 5, a fourth stage of the first fabrication process is depicted and generally designated 500. The fourth stage 500 may follow the third stage 400. In between the fourth stage 500 and the third stage 400, the device (including the layers 208, 206, 204, 102, 122) may be flipped over, and the third SOI substrate layer 208 may be removed. For example, an automated arm may grip the handle 402 and rotate the device. In some examples, the device may not be flipped. In particular examples, the device may be flipped without using the handle 402. Thus, in alternate examples, the device may not include a handle. The third SOI substrate layer 208 may be removed using an etch process performed to expose the etch stop layer 206.

Figure 6:
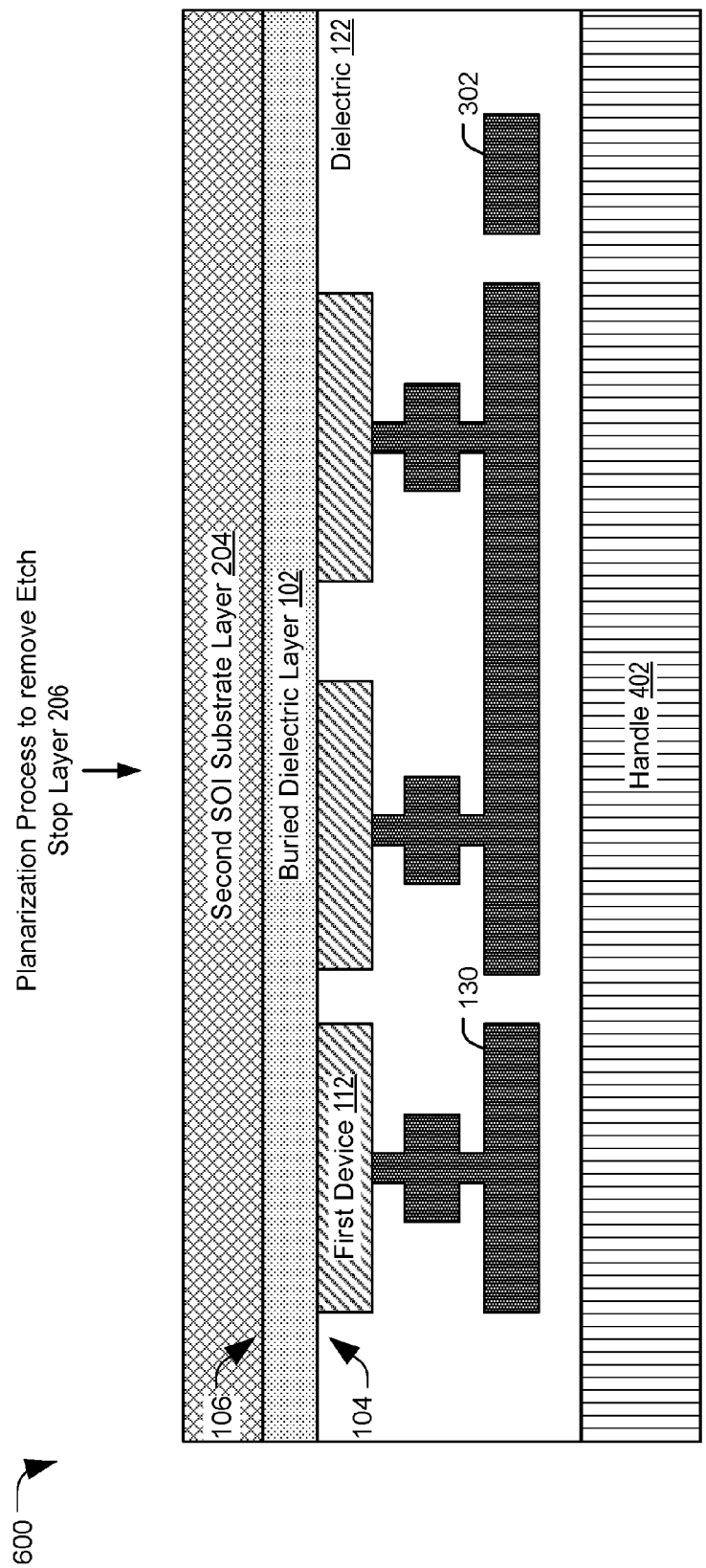

Referring to FIG. 6, a fifth stage of the first fabrication process is depicted and generally designated 600. The fifth stage 600 may follow the fourth stage 500. In between the fifth stage 600 and the fourth stage 500, the etch stop layer 206 may be removed. For example, the etch stop layer 206 may be removed using a thinning process. The thinning process may include a chemical mechanical planarization (CMP) process, a wet etching process, a tetramethylammonium hydroxide etching process, a potassium hydroxide etching process, a mechanical material removal process, another polishing process, or a combination thereof.

Figure 7:
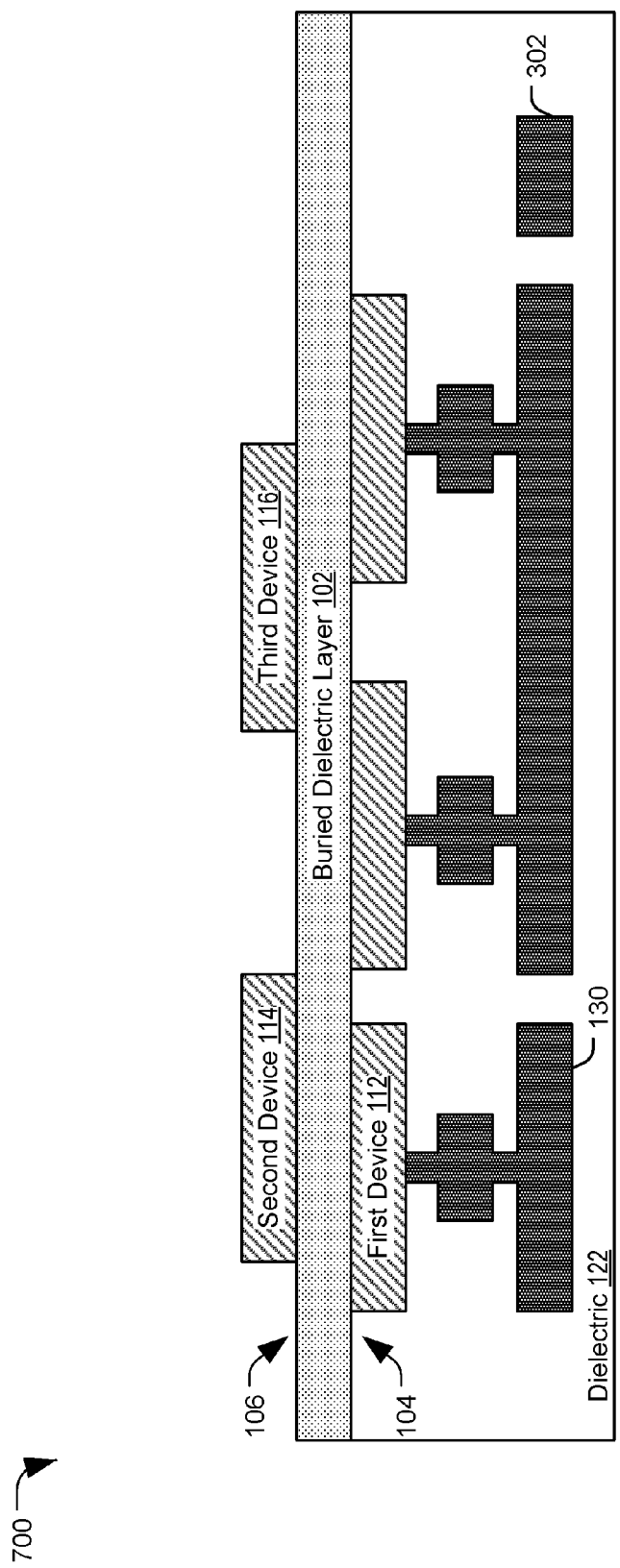

Referring to FIG. 7, a sixth stage of the first fabrication process is depicted and generally designated 700. The sixth stage 700 may follow the fifth stage 600. In between the sixth stage 700 and the fifth stage 600 additional devices, such as the second semiconductor device 114 and the third semiconductor device 116, may be formed on the second side 106 of the buried dielectric layer 102. The second semiconductor device 114 and the third semiconductor device 116 may be formed, in some examples, by one or more semiconductor manufacturing processes. For example, one or more etching processes, doping processes, planarization processes, deposition processes (e.g., physical vapor deposition, chemical vapor deposition, atomic layer deposition, etc.), epitaxial growth processes, annealing processes, silicidation processes, stress introduction processes, etc. may be applied to the second SOI substrate layer 204 (and any additional layers formed on the second SOI substrate layer 204) to form the second semiconductor device 114 and the third semiconductor device 116 and to remove the second SOI substrate layer 204. In alternate embodiments, at least a portion of the second SOI substrate layer 204 may be removed prior to formation of the second semiconductor device 114 and the third semiconductor device 116.

Figure 8:
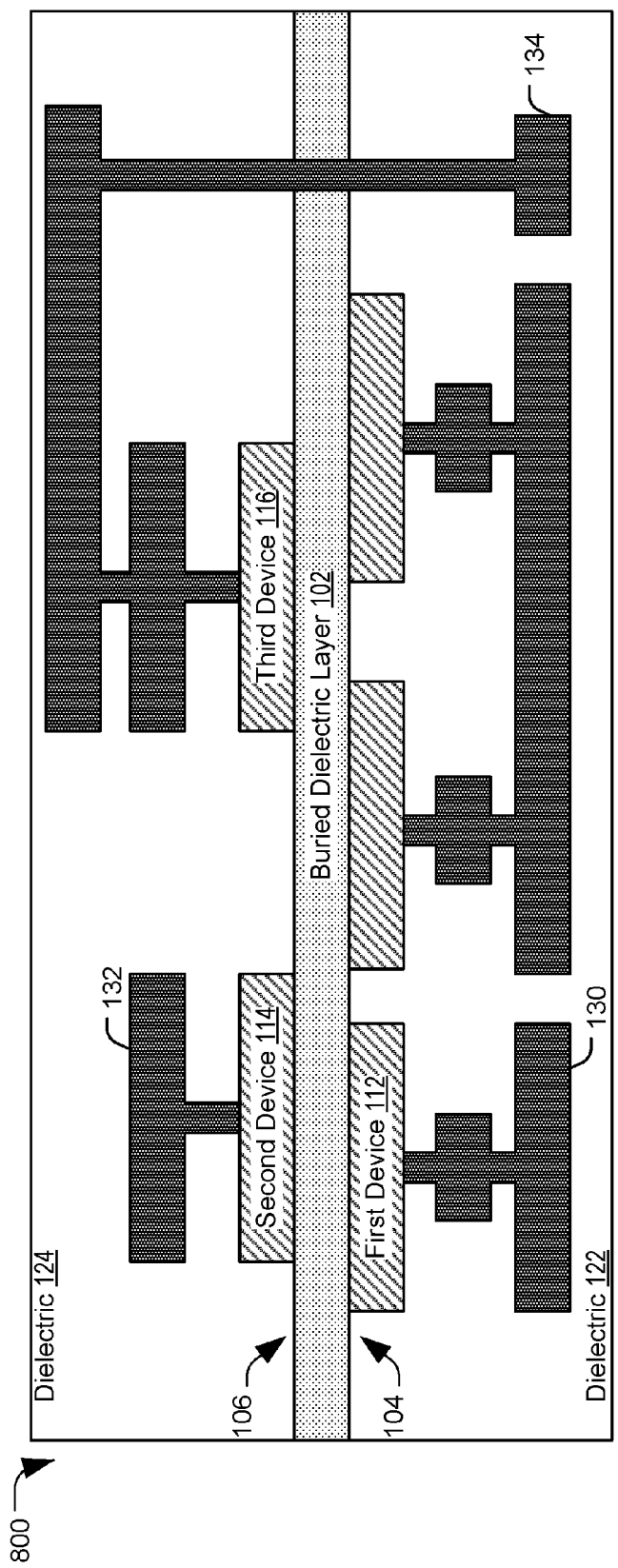

Referring to FIG. 8 a seventh stage of the first fabrication process is depicted and generally designated 800. The seventh stage 800 may follow the sixth stage 700. In between the seventh stage 800 and the sixth stage 700, the second metal structure 132 and the second dielectric layer 124 may be formed and the third metal structure 134 may be completed. The second dielectric layer 124 may be formed using one or more deposition processes. The one or more deposition processes may include a physical vapor deposition process, a plasma-enhanced chemical vapor deposition process, a low-pressure chemical vapor deposition process, an atomic layer deposition process, or a combination thereof, as illustrative, non-limiting examples. In an illustrative example, one or more cavities may be formed in the second dielectric layer 124 (e.g., using an etching process) and the second metal structure 132 and remainder of the third metal structure 134 may be formed in the one or more cavities (e.g., using one or more deposition processes, such as a chemical vapor deposition processes, an atomic layer deposition process, or a combination thereof). In a particular example, completing the third metal structure 134 includes etching through the buried dielectric layer 102 and the first dielectric layer 122 to the first portion 302 of the third metal structure 134.

FIG. 8 may illustrate the device 100 of FIG. 1 in a flipped orientation. Thus, the first process illustrated in FIGS. 2-8 may be used to fabricate a device having semiconductor devices on two sides of a buried dielectric layer, such as the device 100 of FIG. 1. It is noted that the first process may not include a hydrogen implantation process, and may be less expensive than processes of fabrication a device that include the hydrogen implantation process. The first process may involve a decreased number of masks as compared to other processes of fabricating devices.

FIGS. 9-15 illustrate examples of stages of a second fabrication process that may be used to fabricate devices, such as the device 100, having semiconductor devices on two sides of a buried dielectric layer. The stages of the second fabrication process are shown as cross-sectional views of formation of the device 100.

Figure 9:
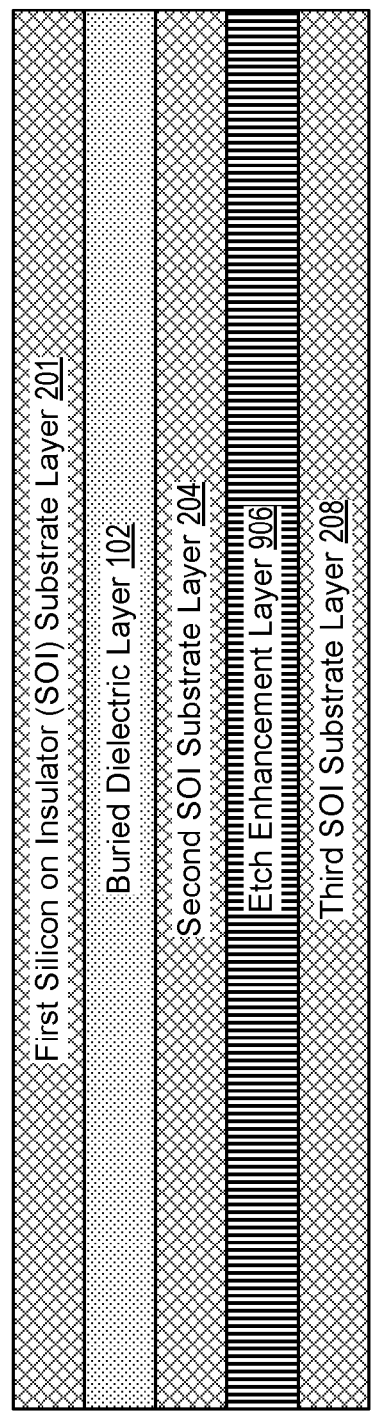

Referring to FIG. 9, a first stage of the second fabrication process is depicted and generally designated 900. The first stage 900 may correspond to the first stage 200 illustrated and described with reference to FIG. 2, except that FIG. 9 depicts an etch enhancement layer 906 in place of the etch stop layer 206 of FIG. 2. The etch enhancement layer 906 may be made of a material that may be removed relatively quickly by an etching process as compared to other materials.

Figure 10:
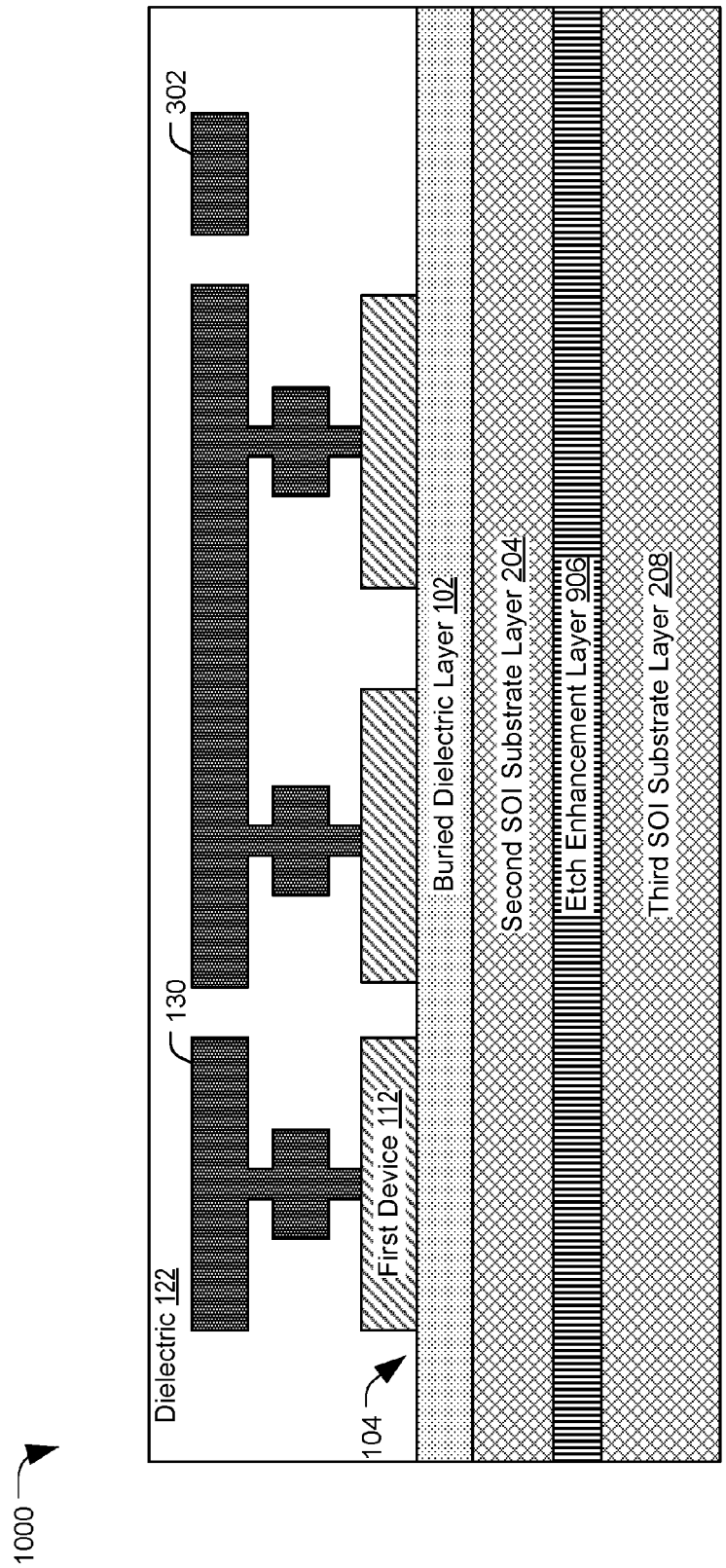

Referring to FIG. 10, a second stage of the second fabrication process is depicted and generally designated 1000. The second stage 1000 may follow the first stage 900. The second stage 1000 may correspond to the second stage 300 illustrated and described with reference to FIG. 3, except that FIG. 10 depicts the etch enhancement layer 906 in place of the etch stop layer 206 of FIG. 3.

Figure 11:
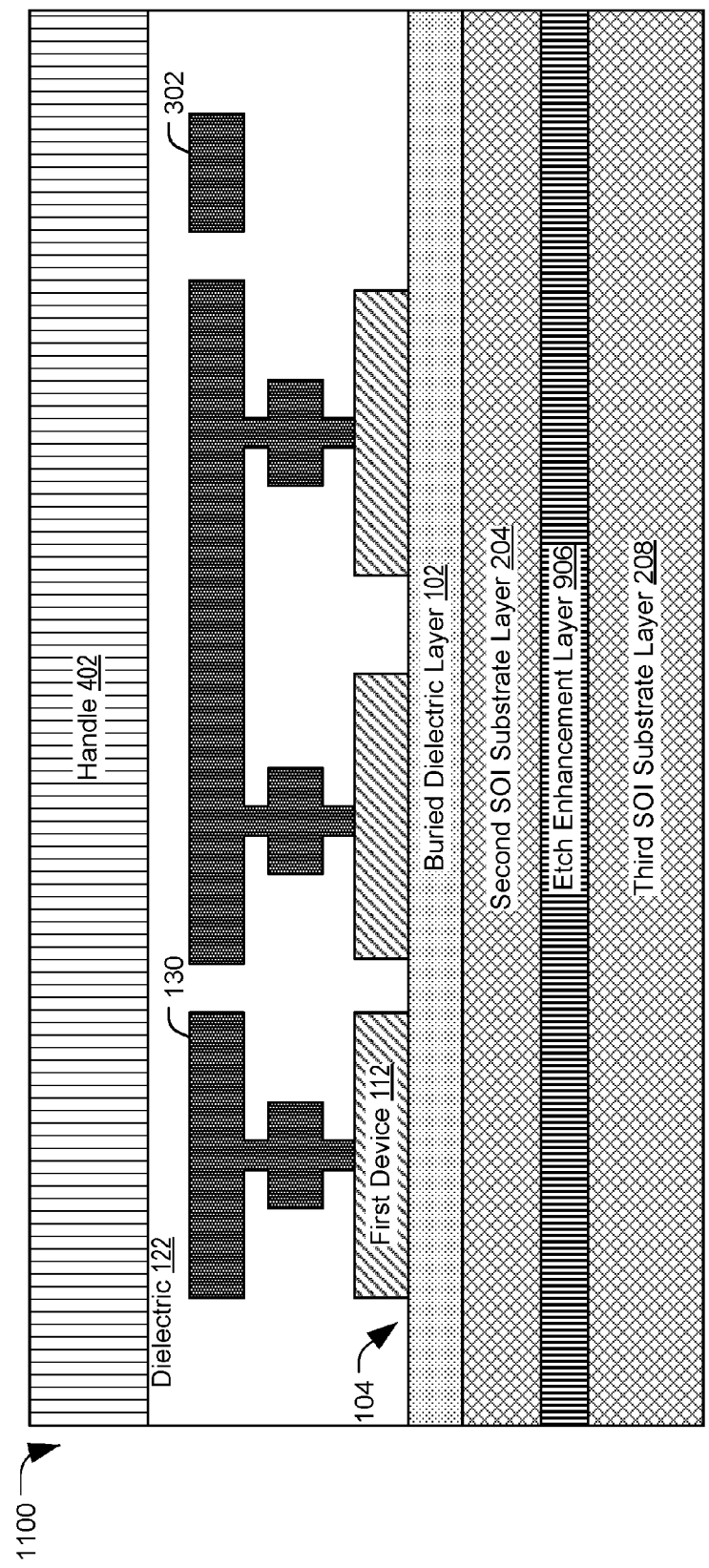

Referring to FIG. 11, a third stage of the second fabrication process is depicted and generally designated 1100. The third stage 1100 may follow the second stage 1000. The third stage 1100 may correspond to the third stage 400 illustrated and described with reference to FIG. 4, except that FIG. 11 depicts the etch enhancement layer 906 in place of the etch stop layer 206 of FIG. 4.

Figure 12:
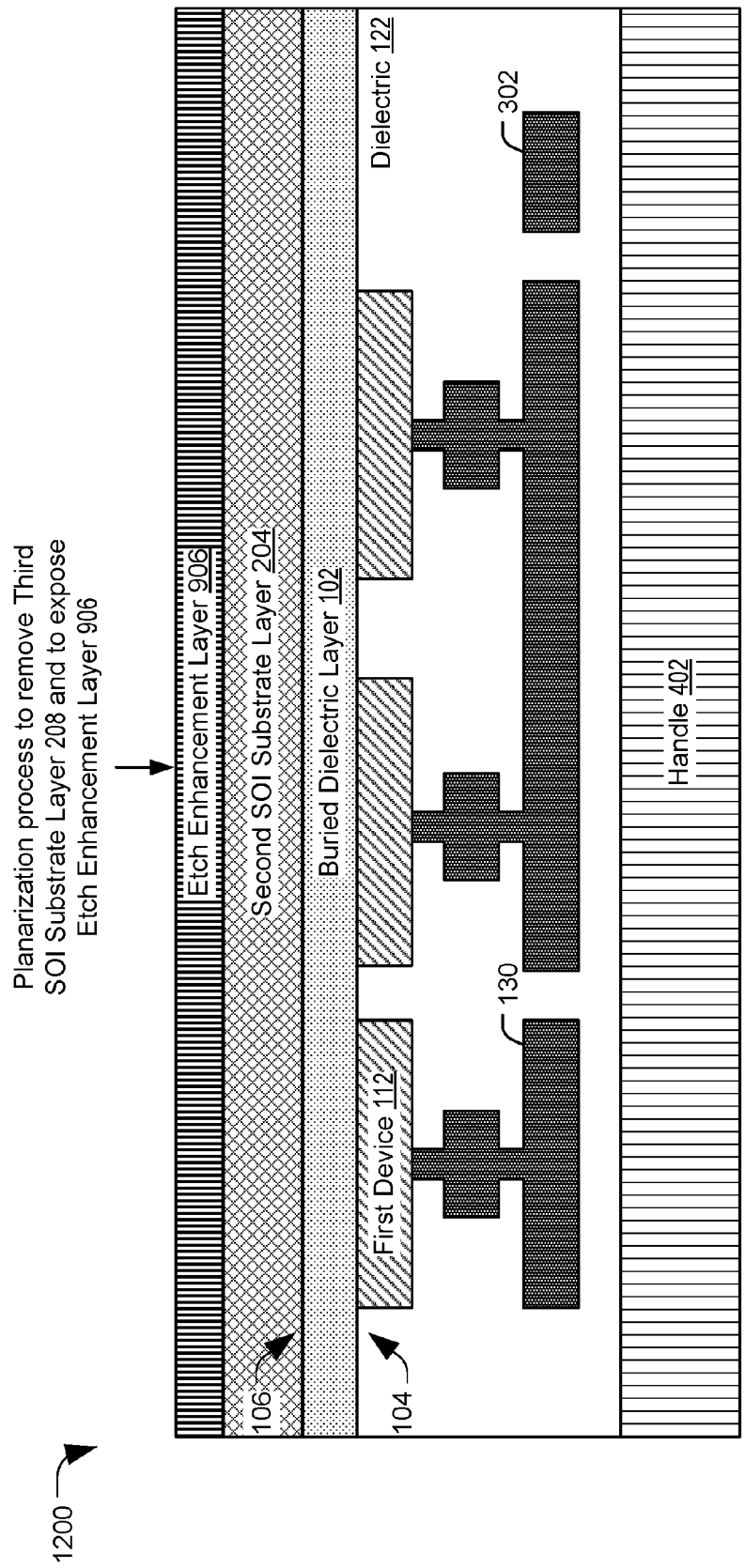

Referring to FIG. 12, a fourth stage of the second fabrication process is depicted and generally designated 1200. The fourth stage 1200 may follow the third stage 1100. In between the fourth stage 1200 and the third stage 1100, the device (including the layers 208, 906, 204, 102, 122) may be flipped over, and the third SOI substrate layer 208 may be removed. For example, an automated arm may grip the handle 402 and rotate the device. In some examples, the device may not be flipped. In particular examples, the device may be flipped without using the handle 402. Thus, in alternate examples, the device may not include a handle. The third SOI substrate layer 208 may be removed using a thinning process performed to expose the etch enhancement layer 906. The thinning process may include an etching process, a grinding process, chemical mechanical planarization (CMP) process, another polishing process, or a combination thereof.

Figure 13:
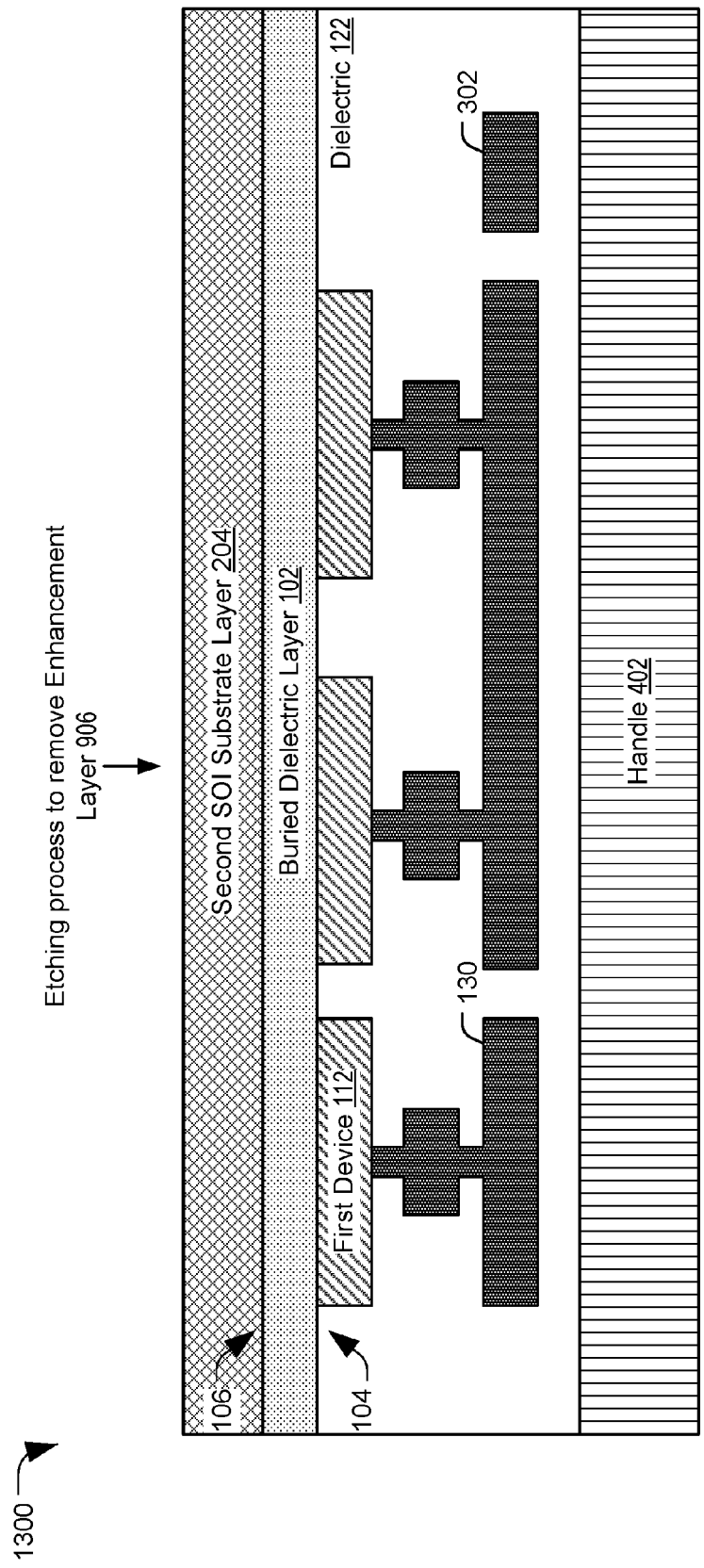

Referring to FIG. 13, a fifth stage of the second fabrication process is depicted and generally designated 1300. The fifth stage 1300 may follow the fourth stage 1200. In between the fifth stage 1300 and the fourth stage 1200, the etch enhancement layer 906 may be removed. For example, the etch enhancement layer 906 may be removed using an etching process.

Figure 14:
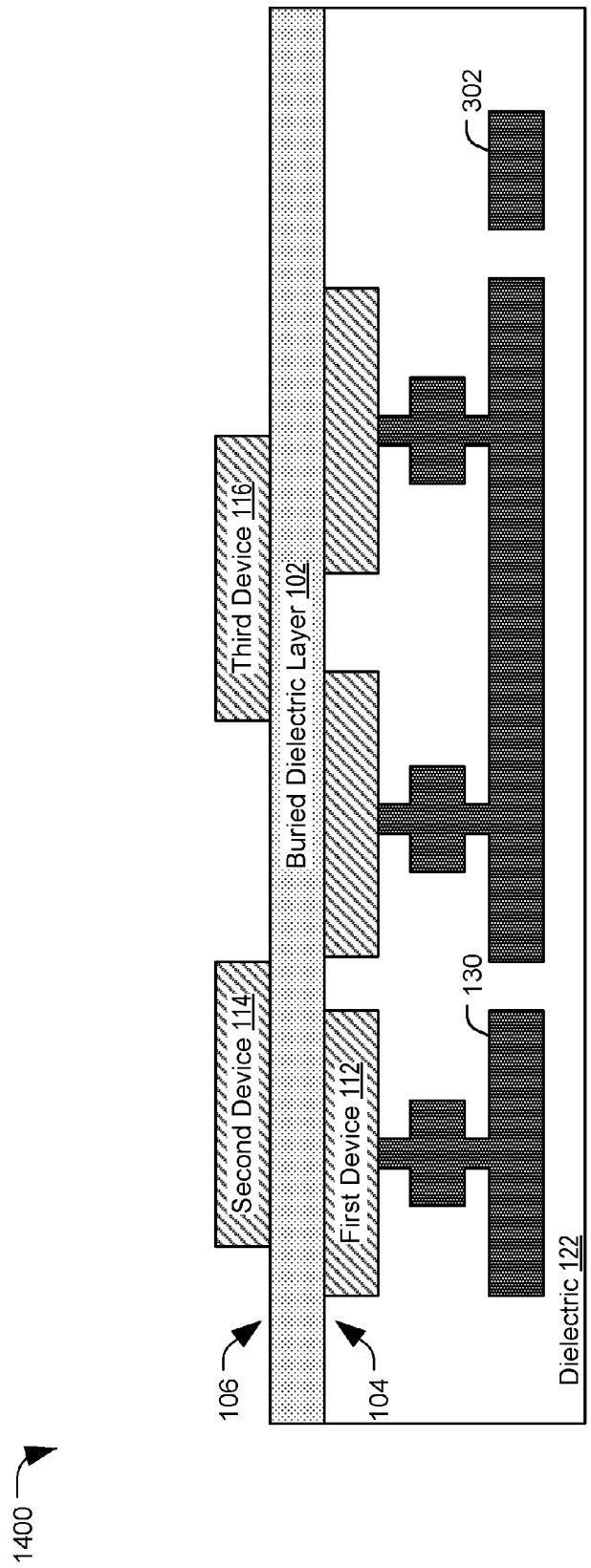

Referring to FIG. 14, a sixth stage of the second fabrication process is depicted and generally designated 1400. The sixth stage 1400 may follow the fifth stage 1300. The sixth stage 1400 may correspond to the sixth stage 700 illustrated and described with reference to FIG. 7.

Figure 15:
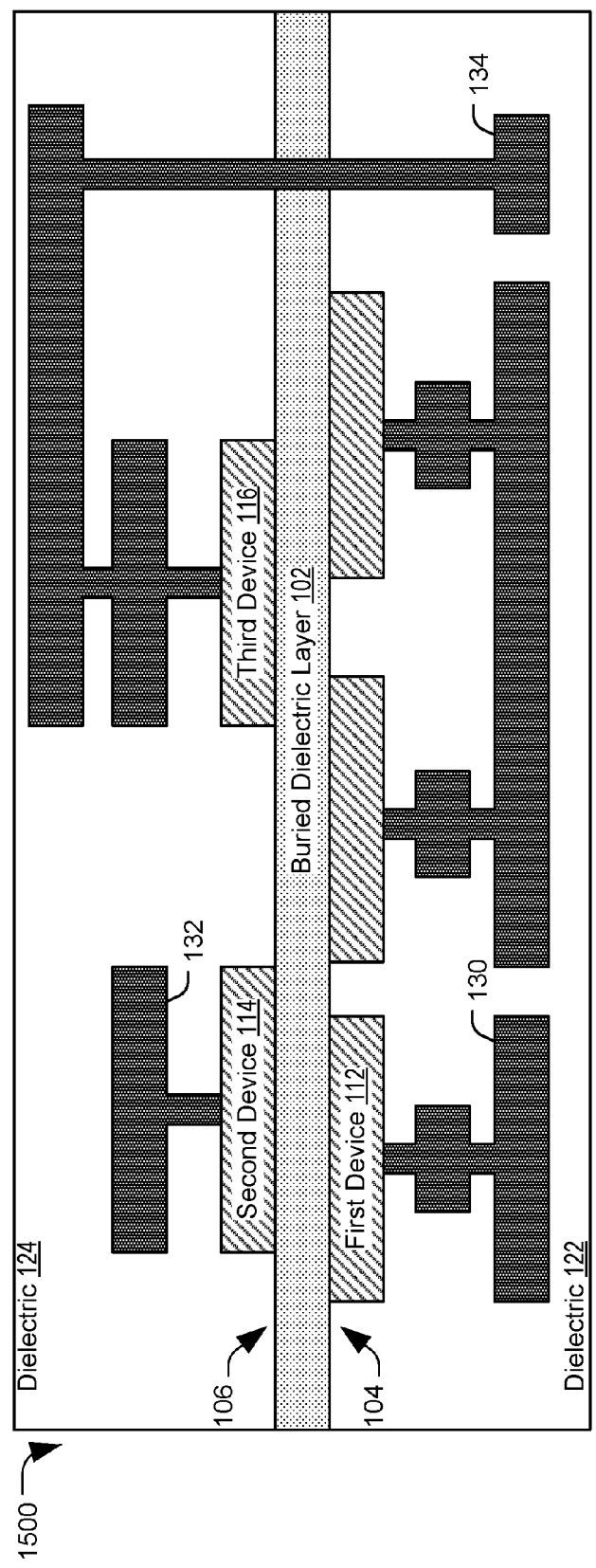

Referring to FIG. 15, a seventh stage of the second fabrication process is depicted and generally designated 1500. The seventh stage 1500 may follow the sixth stage 1400. The seventh stage 1500 may correspond to the seventh stage 800 illustrated and described with reference to FIG. 8.

Thus, the second process illustrated in FIGS. 9-15 may be used to fabricate a device having semiconductor devices on two sides of a buried dielectric layer, such as the device 100 of FIG. 1. It is noted that the second process may not include a hydrogen implantation process, and may be less expensive than processes of fabrication a device that include the hydrogen implantation process. Further, the second process may utilize fewer masks as compared to other device fabrication processes. As illustrated and described with reference to FIGS. 5 and 6, the first process may include an etching process followed by a planarization process. The second process may include a planarization process followed by an etching process, as illustrated and described with reference to FIGS. 12 and 13.

Referring to FIG. 16, a flowchart illustrating a method 1600 is shown. The method 1600 may correspond to the first process illustrated and described with reference to FIGS. 2-8. The method 1600 may be performed, for example, by an automated fabrication machine (e.g., a system as described with reference to FIG. 19 or one or more other fabrication apparatus(es)). The automated fabrication machine may correspond to one or more devices.

The method 1600 includes performing an etching process from a second side of the buried dielectric layer to expose an etch stop layer, at 1602. The second side of the buried dielectric layer is opposite a first side of the buried dielectric layer, and a first semiconductor device is positioned on the first side of the buried dielectric layer. For example, an etching process may be performed from the second side 106 of the buried dielectric layer 102 to remove the third SOI substrate layer 208 and to expose the etch stop layer 206, as illustrated in FIG. 5. The second side 106 of the buried dielectric layer 102 is opposite the first side 104 of the buried dielectric layer 102, and the first semiconductor device 112 is positioned on the first side 104.

The method 1600 further includes forming a second semiconductor device on the second side of the buried dielectric layer, at 1604. For example, the second semiconductor device 114 may be formed on the second side 106 of the buried dielectric layer 102, as illustrated in FIG. 7. Thus, the method 1600 may be used to form a device having semiconductor devices on two sides of a buried dielectric layer, such as the device 100 of FIG. 1.

In a particular implementation, the method 1600 further includes performing a thinning process to remove the etch stop layer prior to forming the second semiconductor device. For example, a thinning process may be performed to remove the etch stop layer 206, as illustrated in FIG. 6. In some examples, the thinning process may include a chemical mechanical planarization (CMP) process, a wet etching process, a tetramethylammonium hydroxide etching process, a potassium hydroxide etching process, a mechanical material removal process, or a combination thereof.

In a particular implementation of the method 1600, the first semiconductor device is formed on the first side of the buried dielectric layer prior to performing the etching process. For example, the first semiconductor device 112 may be formed on the first side 104 of the buried dielectric layer 102, as illustrated in FIG. 3.

In a particular implementation, the method 1600 further includes depositing a dielectric layer on the first side of the buried dielectric layer. For example, the first dielectric layer 122 may be formed (e.g., using a physical vapor deposition process) on the first side 104 of the buried dielectric layer 102, as illustrated in FIG. 3.

In a particular implementation, the method 1600 further includes attaching a handle to a dielectric layer positioned over the first semiconductor device. The handle may include a wafer. In a particular example, the wafer includes silicon, glass, gallium arsenide, sapphire, or a combination thereof. The buried dielectric layer may be flipped using a mechanical arm to manipulate the handle. For example, the handle 402 may be attached to the first dielectric layer 122, as illustrated in FIG. 4. The buried dielectric layer 102 may be flipped, for example, by using a mechanical arm to manipulate the handle 402, as illustrated in FIG. 5.

In a particular implementation, the method 1600 further includes depositing a dielectric layer on the second side of the buried dielectric layer. For example, the second dielectric layer 124 may be formed (e.g., using a physical vapor deposition process) on the second side 106 of the buried dielectric layer 102, as illustrated in FIG. 8.

In a particular implementation of the method 1600, the first semiconductor device is one of a plurality of semiconductor devices on the first side of the buried dielectric layer. For example, as illustrated in FIG. 3, more than one semiconductor device may be formed on the first side 104 of the buried dielectric layer 102.

In particular implementations of the method 1600, the first semiconductor device includes a transistor, a capacitor, a diode, an inducer, a resistor, a thyristor, or another type of semiconductor device.

In a particular implementation of the method 1600, the etch stop layer is formed using an epitaxial growth process. In another particular implementation of the method 1600, the etch stop layer is formed using a porous silicon formation process. In another particular implementation of the method 1600, the etch stop layer is formed using an ion implantation process.

In a particular implementation of the method 1600, prior to performing the etching process, the etch stop layer is positioned between a SOI substrate layer and the buried dielectric layer and the etching process removes the SOI substrate layer. For example, as illustrated in FIG. 4, the etch stop layer 206 may be positioned between the buried dielectric layer 102 and the third SOI substrate layer 208. As illustrated in FIG. 5, the etching process may remove the third SOI substrate layer 208.

In a particular implementation of the method 1600, the etch stop layer is formed by implanting a material other than hydrogen on the second side of the buried dielectric layer. For example, the etch stop layer 206 may be formed by implanting a material other than hydrogen on the second side 106 of the buried dielectric layer 102.

In a particular implementation of the method 1600, the etching process includes a wet etching process. For example, the etching process illustrated in FIG. 5 may be a wet etching process.

Referring to FIG. 17, a flowchart illustrating a method 1700 is shown. The method 1700 may correspond to the second process illustrated and described with reference to FIGS. 9-15. The method 1700 may be performed, for example, by an automated fabrication machine (e.g., a system as described with reference to FIG. 19 or one or more other fabrication apparatus(es)). The automated fabrication machine may correspond to one or more devices.

The method 1700 includes performing a thinning process from a second side of the buried dielectric layer to expose an etch enhancement layer, at 1702. The second side of the buried dielectric layer is opposite a first side of the buried dielectric layer, and a first semiconductor device is positioned on the first side of the buried dielectric layer. For example, a thinning process may be performed from the second side 106 of the buried dielectric layer 102 to remove the third SOI substrate layer 208 and to expose the etch enhancement layer 906, as illustrated in FIG. 12. The second side 106 of the buried dielectric layer 102 is opposite the first side 104 of the buried dielectric layer 102, and the first semiconductor device 112 is positioned on the first side 104 of the buried dielectric layer 102.

The method 1700 further includes performing an etching process to remove the etch enhancement layer, at 1706. For example, the etch enhancement layer 906 may be removed using an etching process, as shown in FIG. 13.

The method 1700 further includes forming a second semiconductor device on the second side of the buried dielectric layer, at 1708. For example, the second semiconductor device 114 may be formed on the second side 106 of the buried dielectric layer 102, as illustrated in FIG. 14. Thus, the method 1700 may be used to form a device having semiconductor devices on two sides of a buried dielectric layer, such as the device 100 of FIG. 1.

In a particular implementation, the thinning process includes an etching process, a grinding process, a CMP process, or a combination thereof. For example, the thinning process illustrated in FIG. 12 may correspond to an etching process, a grinding process, a CMP process, or a combination thereof.

In a particular implementation of the method 1700, the first semiconductor device is formed on the first side of the buried dielectric layer prior to performing the planarization process. For example, the first semiconductor device 112 may be formed on the first side 104 of the buried dielectric layer 102, as illustrated in FIG. 10.

In a particular implementation, the method 1700 further includes attaching a handle to a dielectric layer, the dielectric layer positioned over the first semiconductor device. The method 1700 may further include flipping the buried dielectric layer using a mechanical arm to manipulate the handle. For example, the handle 402 may be attached to the first dielectric layer 122, as illustrated in FIG. 11. The buried dielectric layer 102 may be flipped, for example, by using a mechanical arm to manipulate the handle 402, as illustrated in FIG. 12.

In a particular implementation, the method 1700 further includes depositing a dielectric layer on the second side of the buried dielectric layer. For example, the second dielectric layer 124 may be formed (e.g., using a physical vapor deposition process) on the second side 106 of the buried dielectric layer 102, as illustrated in FIG. 15.

In a particular implementation of the method 1700, the first semiconductor device is one of a plurality of semiconductor devices on the first side of the buried dielectric layer. For example, as illustrated in FIG. 10, more than one semiconductor device may be formed on the first side 104 of the buried dielectric layer 102.

In particular implementations of the method 1700, the first semiconductor device includes a transistor, a capacitor, a diode, or another type of semiconductor device.

In a particular implementation of the method 1700, the etch enhancement layer is formed by implanting a material other than hydrogen on the second side of the buried dielectric layer. For example, the etch enhancement layer may be formed by implanting a material other than hydrogen on the second side 106 of the buried dielectric layer 102. As another example, the etch enhancement layer may be formed by creating a porous layer and then growing a semiconductor material (e.g., silicon) on the second side of the buried dielectric layer. The porous layer may be 1 to 30 microns thick in some examples.

Figure 18:
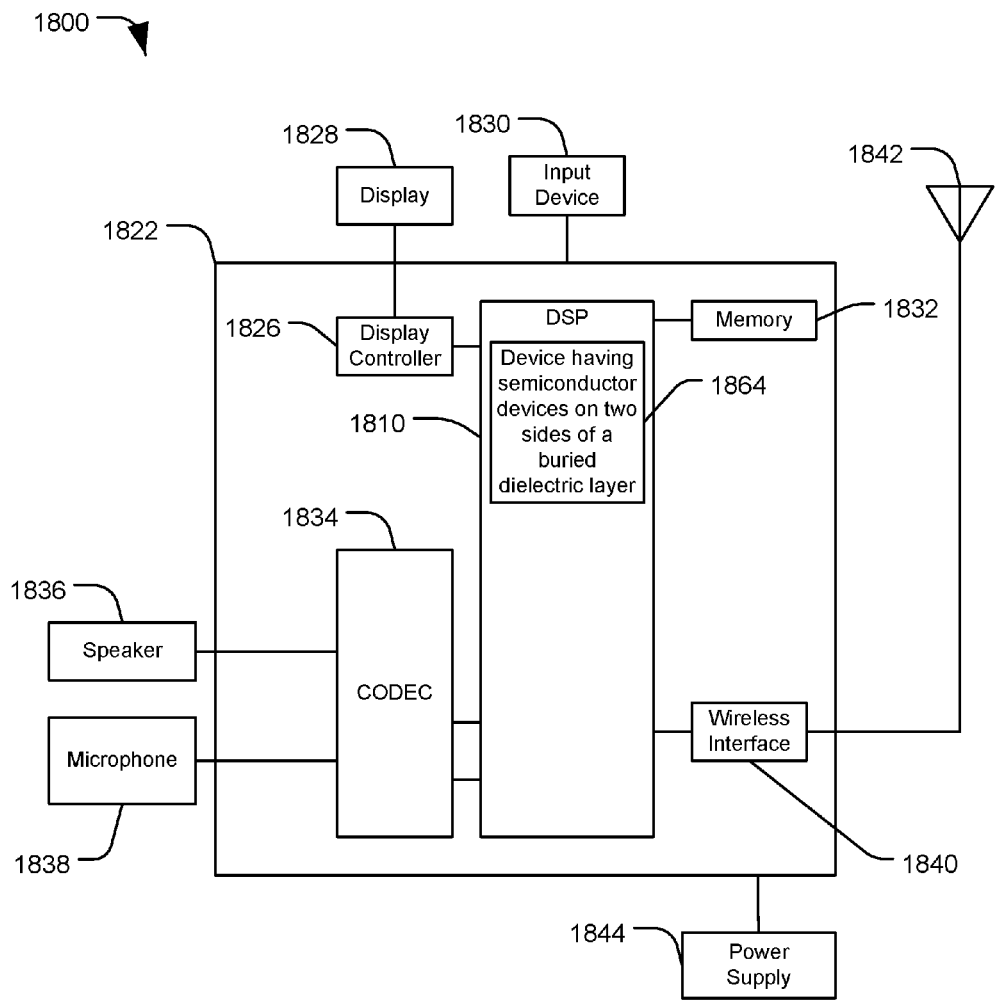
FIG. 18 is a block diagram illustrating a device that includes a device having semiconductor devices on two sides of a buried dielectric layer.

Referring to FIG. 18, a block diagram of a particular illustrative implementation of a device (e.g., a wireless communication device) is depicted and generally designated 1800. In various implementations, the device 1800 may have more or fewer components than illustrated in FIG. 18.

In a particular implementation, the device 1800 includes a processor 1810, such as a central processing unit (CPU) or a digital signal processor (DSP), coupled to a memory 1832. The processor 1810 may include a device 1864 having semiconductor devices on two sides of a buried dielectric layer, such as the device 100.

The memory 1832 includes instructions 1868 (e.g., executable instructions) such as computer-readable instructions or processor-readable instructions. The instructions 1868 may include one or more instructions that are executable by a computer, such as the processor 1810.

FIG. 18 also illustrates a display controller 1826 that is coupled to the processor 1810 and to a display 1828. A coder/decoder (CODEC) 1834 may also be coupled to the processor 1810. Speakers 1836 and microphones 1838 may be coupled to the CODEC 1834.

FIG. 18 also illustrates that a wireless interface 1840, such as a wireless controller, and a transceiver 1846 may be coupled to the processor 1810 and to an antenna 1842, such that wireless data received using the antenna 1842, the transceiver 1846, and the wireless interface 1840 may be provided to the processor 1810. In some implementations, the processor 1810, the display controller 1826, the memory 1832, the CODEC 1834, the wireless interface 1840, and the transceiver 1846 are included in a system-in-package or system-on-chip device 1822. In some implementations, an input device 1830 and a power supply 1844 are coupled to the system-on-chip device 1822. Moreover, in a particular implementation, as illustrated in FIG. 18, the display 1828, the input device 1830, the speakers 1836, the microphones 1838, the antenna 1842, and the power supply 1844 are external to the system-on-chip device 1822. In a particular implementation, each of the display 1828, the input device

1830, the speakers 1836, the microphones 1838, the antenna 1842, and the power supply 1844 may be coupled to a component of the system-on-chip device 1822, such as an interface or a controller.

The device 1800 may include a communications device, a fixed location data unit, a mobile location data unit, a mobile phone, a cellular phone, a satellite phone, a computer, a tablet, a portable computer, a display device, a media player, or a desktop computer. Alternatively or additionally, the device 1800 may include a set top box, an entertainment unit, a navigation device, a personal digital assistant (PDA), a monitor, a computer monitor, a television, a radio, a satellite radio, a music player, a digital music player, a portable music player, a video player, a digital video player, a digital video disc (DVD) player, a portable digital video player, a vehicle, a component integrated within a vehicle, any other device that includes a processor or that stores or retrieves data or computer instructions, or a combination thereof. As another illustrative, non-limiting example, the system or the apparatus may include remote units, such as hand-held personal communication systems (PCS) units, portable data units such as global positioning system (GPS) enabled devices, meter reading equipment, or any other device that includes a processor or that stores or retrieves data or computer instructions, or any combination thereof.

While FIG. 18 illustrates the processor 1810 as including the device 1864, any component of a device, such as the device 1800, may include a device having semiconductor devices on two sides of a buried dielectric layer. For example, the wireless interface 1840, the memory 1832, the input device 1830, the display 1828, the display controller 1826, or any other electronic device may include a device having semiconductor devices on two sides of a buried dielectric layer.

While FIG. 18 illustrates a wireless communication device including a device having semiconductor devices on two sides of a buried dielectric layer, device having semiconductor devices on two sides of a buried dielectric layer may be included in various other electronic devices. For example, a device having semiconductor devices on two sides of a buried dielectric layer, as described with reference to FIGS. 1-17, may be included in one or more components of a base station.

A base station may be part of a wireless communication system. The wireless communication system may include multiple base stations and multiple wireless devices. The wireless communication system may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA.

Various functions may be performed by one or more components of the base station, such as sending and receiving messages and data (e.g., audio data). The one or more components of the base station may include a processor (e.g., a CPU), a transcoder, a memory, a network connection, a media gateway, a demodulator, a transmission data processor, a receiver data processor, a transmission multiple input-multiple output (MIMO) processor, transmitters and receivers (e.g., transceivers), an array of antennas, or a combination thereof. One or more of the components of the base station may include a device having semiconductor devices on two sides of a buried dielectric layer, as described above with reference to FIGS. 1-18.

During operation of a base station, one or more antennas of the base station may receive a data stream from a wireless device. A transceiver may receive the data stream from the one or more antennas and may provide the data stream to the demodulator. The demodulator may demodulate modulated signals of the data stream and provide demodulated data to the receiver data processor. The receiver data processor may extract audio data from the demodulated data and provide the extracted audio data to the processor.

The processor may provide the audio data to the transcoder for transcoding. The decoder of the transcoder may decode the audio data from a first format into decoded audio data and the encoder may encode the decoded audio data into a second format. In some implementations, the encoder may encode the audio data using a higher data rate (e.g., upconvert) or a lower data rate (e.g., downconvert) than received from the wireless device. In other implementations the audio data may not be transcoded. Transcoding operations (e.g., decoding and encoding) may be performed by multiple components of the base station. For example, decoding may be performed by the receiver data processor and encoding may be performed by the transmission data processor. In other implementations, the processor may provide the audio data to the media gateway for conversion to another transmission protocol, coding scheme, or both. The media gateway may provide the converted data to another base station or core network using the network connection.

Figure 19:
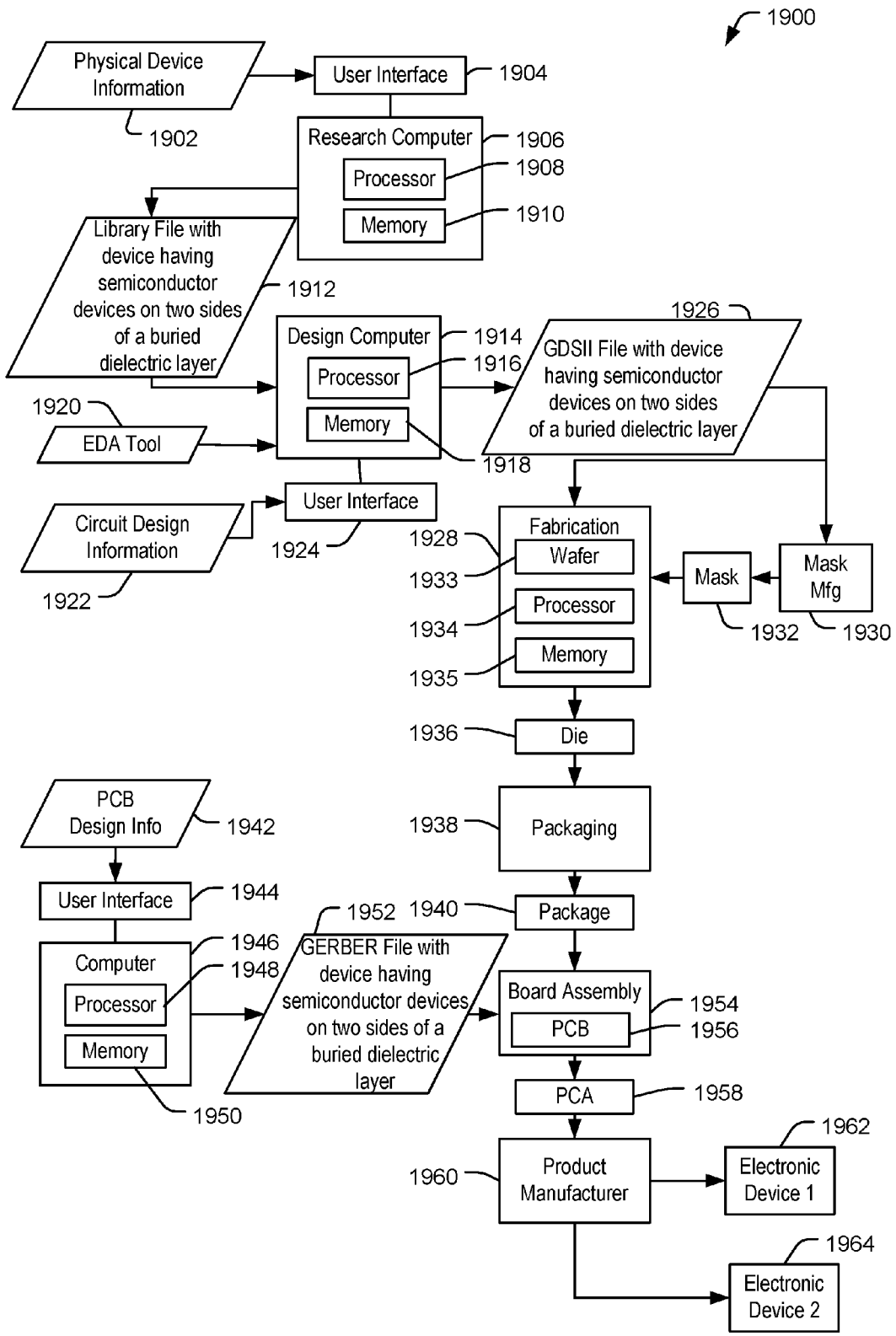
FIG. 19 is a data flow diagram of an illustrative example of a manufacturing process to manufacture electronic devices that include a device having semiconductor devices on two sides of a buried dielectric layer.

The foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 19 depicts a particular illustrative aspect of an electronic device manufacturing process 1900.

Physical device information 1902 is received at the manufacturing process 1900, such as at a research computer 1906. The physical device information 1902 may include design information representing at least one physical property of the device 100, device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof. For example, the physical device information 1902 may include physical parameters, material characteristics, and structure information that is entered using a user interface 1904 coupled to the research computer 1906. For example, the physical device information 1902 may describe a device having semiconductor devices on two sides of a buried dielectric layer. To illustrate, the physical device information 1902 may describe the device 100. The research computer 1906 includes a processor 1908, such as one or more processing cores, coupled to a computer-readable medium (e.g., a non-transitory computer-readable medium), such as a memory 1910. The memory 1910 may store computer-readable instructions that are executable to cause the processor 1908 to transform the physical device information 1902 to comply with a file format and to generate a library file 1912.

In some implementations, the library file 1912 includes at least one data file including the transformed design information. For example, the library file 1912 may include a library of devices including a device that includes the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof, that is provided for use with an electronic design automation (EDA) tool 1920. For example, the library file 1912 may include information describing fabrication of the device 100 according to the first process described with reference to FIGS. 2-8 or according to the second process described with reference to FIGS. 9-15.

The library file 1912 may be used in conjunction with the EDA tool 1920 at a design computer 1914 including a processor 1916, such as one or more processing cores, coupled to a memory 1918. The EDA tool 1920 may be stored as processor executable instructions at the memory 1918 to enable a user of the design computer 1914 to design the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof. For example, a user of the design computer 1914 may enter circuit design information 1922 using a user interface 1924 coupled to the design computer 1914.

The circuit design information 1922 may include design information representing at least one physical property of a component of the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof. To illustrate, the circuit design property may include identification of particular circuits and relationships to other elements in a circuit design, positioning information, feature size information, interconnection information, or other information representing a physical property of components of the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof.

The design computer 1914 may be configured to transform the design information, including the circuit design information 1922, to comply with a file format. To illustrate, the file format may include a database binary file format representing planar geometric shapes, text labels, and other information about a circuit layout in a hierarchical format, such as a Graphic Data System (GDSII) file format. The design computer 1914 may be configured to generate a data file including the transformed design information, such as a GDSII file 1926 that includes information describing the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof, in addition to other circuits or information. To illustrate, the data file may include information corresponding to a system-on-chip (SOC) that includes the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof, and that also includes additional electronic circuits and components within the SOC.

The GDSII file 1926 may be received at a fabrication process 1928 to manufacture the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof, according to transformed information in the GDSII file 1926. For example, a device manufacture process may include providing the GDSII file 1926 to a mask manufacturer 1930 to create one or more masks, such as masks to be used with photolithography processing, illustrated as a representative mask 1932. The mask 1932 may be used during the fabrication process 1928 to generate one or more wafers 1933, which may be tested and separated into dies, such as a representative die 1936. The die 1936 includes a circuit including a device that includes the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof.

For example, the fabrication process 1928 may include a processor 1934 and a memory 1935 to initiate and/or control the fabrication process 1928. The memory 1935 may include executable instructions such as computer-readable instructions or processor-readable instructions. The executable instructions may include one or more instructions that are executable by a computer such as the processor 1934.

The fabrication process 1928 may be implemented by a fabrication system that is fully automated or partially automated. For example, the fabrication process 1928 may be automated according to a schedule. The fabrication system may include fabrication equipment (e.g., processing tools) to perform one or more operations to form the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof. For example, the fabrication equipment may be configured to deposit one or more materials, etch one or more materials, etch one or more dielectric materials, perform a chemical mechanical planarization process, perform a thermal anneal, deposit a conductive material, perform a chemical vapor deposition (CVD) process, etc., or a combination thereof, as illustrative, non-limiting examples.

The fabrication system (e.g., an automated system that performs the fabrication process 1928) may have a distributed architecture (e.g., a hierarchy). For example, the fabrication system may include one or more processors, such as the processor 1934, one or more memories, such as the memory 1935, and/or controllers that are distributed according to the distributed architecture. The distributed architecture may include a high-level processor that controls or initiates operations of one or more low-level systems. For example, a high-level portion of the fabrication process 1928 may include one or more processors, such as the processor 1934, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In some implementations, the fabrication system may include multiple processors that are distributed in the fabrication system. For example, a controller of a low-level system component may include a processor, such as the processor 1934.

Alternatively, the processor 1934 may be a part of a high-level system, subsystem, or component of the fabrication system. In another implementation, the processor 1934 includes distributed processing at various levels and components of a fabrication system.

Thus, the processor 1934 may include processor-executable instructions that, when executed by the processor 1934, cause the processor 1934 to initiate or control formation of a device having semiconductor devices on two sides of a buried dielectric layer, such as the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof. In some implementations, the memory 1935 is a non-transient computer-readable medium storing computer-executable instructions that are executable by the processor 1934 to cause the processor 1934 to initiate formation of a semiconductor device in accordance with at least a portion of the method 1600 of FIG. 16 or the method 1700 of FIG. 17. For example, the computer executable instructions may be executable to cause the processor 1934 to initiate or control formation of the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof.

The die 1936 may be provided to a packaging process 1938 where the die 1936 is incorporated into a representative package 1940. For example, the package 1940 may include the single die 1936 or multiple dies, such as a system-in-package (SiP) arrangement. For example, the package 1940 may include or correspond to the system in package or system-on-chip device 1822 of FIG. 18. The package 1940 may be configured to conform to one or more standards or specifications, such as Joint Electron Device Engineering Council (JEDEC) standards.

Information regarding the package 1940 may be distributed to various product designers, such as by using a component library stored at a computer 1946. The computer 1946 may include a processor 1948, such as one or more processing cores, coupled to a memory 1950. A printed circuit board (PCB) tool may be stored as processor executable instructions at the memory 1950 to process PCB design information 1942 received from a user of the computer 1946 using a user interface 1944. The PCB design information 1942 may include physical positioning information of a packaged semiconductor device on a circuit board, the packaged semiconductor device including the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof.

The computer 1946 may be configured to transform the PCB design information 1942 to generate a data file, such as a GERBER file 1952 with data that includes physical positioning information of a packaged semiconductor device on a circuit board, as well as layout of electrical connections such as traces (e.g., metal lines) and vias (e.g., via structures), where the packaged semiconductor device corresponds to the package 1940 including the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof. In other implementations, the data file generated by the transformed PCB design information 1942 may have a format other than a GERBER format.

The GERBER file 1952 may be received at a board assembly process 1954 and used to create PCBs, such as a representative PCB 1956, manufactured in accordance with the design information stored within the GERBER file 1952. For example, the GERBER file 1952 may be uploaded to one or more machines to perform various steps of a PCB production process. The PCB 1956 may be populated with electronic components including the package 1940 to form a representative printed circuit assembly (PCA) 1958.

The PCA 1958 may be received at a product manufacture process 1960 and integrated into one or more electronic devices, such as a first representative electronic device 1962 and a second representative electronic device 1964. For example, the first representative electronic device 1962, the second representative electronic device 1964, or both, may include the device 1800 of FIG. 18. As an illustrative, non-limiting example, the first representative electronic device 1962, the second representative electronic device 1964, or both, may include a communications device, a fixed location data unit, a mobile location data unit, a mobile phone, a cellular phone, a satellite phone, a computer, a tablet, a portable computer, or a desktop computer, into which the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof, is integrated.

Alternatively or additionally, the first representative electronic device 1962, the second representative electronic device 1964, or both, may include a base station, a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that includes a processor or that stores or retrieves data or computer instructions, or a combination thereof, into which the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof, is integrated. As another illustrative, non-limiting example, one or more of the electronic devices 1962 and 1964 may include remote units, such as mobile phones, hand-held personal communication systems (PCS) units, portable data units such as personal data assistants, global positioning system (GPS) enabled devices, navigation devices, fixed location data units such as meter reading equipment, any other device that includes a processor or that stores or retrieves data or computer instructions, or any combination thereof. Although FIG. 19 illustrates remote units according to teachings of the disclosure, the disclosure is not limited to these illustrated units. Aspects of the disclosure may be suitably employed in any device which includes active integrated circuitry including memory and on-chip circuitry.

A device that includes the device 100, a device having semiconductor devices on two sides of a buried dielectric layer fabricated according to the method 1600 of FIG. 16, a device having semiconductor devices on two sides of a buried dielectric layer fabricated according to the method 1700 of FIG. 17, or a combination thereof, may be fabricated, processed, and incorporated into an electronic device, as described in the illustrative process 1900. One or more aspects disclosed with respect to FIGS. 1-18, such as specific device structures or instructions to initiate specific fabrication steps, may be included within the library file 1912, the GDSII file 1926 (e.g., a file having a GDSII format), and the GERBER file 1952 (e.g., a file having a GERBER format), as well as stored at the memory 1910 of the research computer 1906, the memory 1918 of the design computer 1914, the memory 1950 of the computer 1946, the memory of one or more other computers or processors (not shown) used at the various stages, such as at the board assembly process 1954, and also incorporated into one or more other physical aspects such as the mask 1932, the die 1936, the package 1940, the PCA 1958, other products such as prototype circuits or devices (not shown), or any combination thereof. Although various representative stages of production from a physical device design to a final product are depicted, in other implementations fewer stages may be used or additional stages may be included. Similarly, the process 1900 may be performed by a single entity or by one or more entities performing various stages of the process 1900.

Although one or more of FIGS. 1-19 may illustrate systems, apparatuses, or methods according to the teachings of the disclosure, the disclosure is not limited to these illustrated systems, apparatuses, or methods. One or more functions or components of any of FIGS. 1-19 as illustrated or described herein may be combined with one or more other portions of another of FIGS. 1-19. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A method comprising:
performing an etching process from a second side of a buried dielectric layer to expose an etch stop layer, wherein prior to performing the etching process, a silicon on insulator (SOI) substrate layer is positioned between the etch stop layer and the buried dielectric layer, wherein the second side of the buried dielectric layer is opposite a first side of the buried dielectric layer, and wherein a first semiconductor device is positioned on the first side of the buried dielectric layer; and
forming a second semiconductor device on the second side of the buried dielectric layer.

2. The method of claim 1, further comprising performing a thinning process to remove the etch stop layer prior to forming the second semiconductor device, wherein the thinning process to remove the etch stop layer exposes the SOI substrate layer.

3. The method of claim 2, wherein the thinning process comprises a chemical mechanical planarization (CMP) process, a wet etching process, a tetramethylammonium hydroxide etching process, a potassium hydroxide etching process, a mechanical material removal process, or a combination thereof.

4. The method of claim 1, wherein the first side of the buried dielectric layer corresponds to a first surface of the buried dielectric layer, wherein the second side of the buried dielectric layer corresponds to a second surface of the buried dielectric layer, and wherein the first semiconductor device is formed in contact with the first side of the buried dielectric layer prior to performing the etching process.

5. The method of claim 1, wherein prior to performing the etching process, the SOI substrate layer is in contact with the etch stop layer, the buried dielectric layer, or both, and wherein forming the second semiconductor device includes removing at least a portion of the SOI substrate layer.

6. The method of claim 1, further comprising attaching a handle to a dielectric layer positioned over the first semiconductor device, wherein the handle comprises a wafer, the wafer including silicon, glass, gallium arsenide, sapphire, or a combination thereof.

7. The method of claim 1, further comprising:
further comprising attaching a handle to a dielectric layer positioned over the first semiconductor device; and
flipping the buried dielectric layer using a mechanical arm to manipulate the handle.

8. The method of claim 1, further comprising depositing a dielectric layer on the second side of the buried dielectric layer.

9. The method of claim 1, wherein the first semiconductor device is one of a plurality of devices on the first side of the buried dielectric layer, and wherein the first semiconductor device includes a transistor, a capacitor, a diode, an inductor, a resistor, or a thyristor.

10. The method of claim 1, further comprising forming the etch stop layer.

11. The method of claim 1, wherein the etch stop layer is formed using an ion implantation process.

12. The method of claim 1, wherein the etch stop layer is formed using an epitaxial growth process.

13. The method of claim 1, wherein the etch stop layer is formed using a porous silicon formation process.

14. The method of claim 1, wherein prior to performing the etching process, the etch stop layer is positioned between a second SOI substrate layer and the buried dielectric layer, and wherein the etching process removes the second SOI substrate layer.

15. The method of claim 1, wherein the etch stop layer is formed by implanting a material other than hydrogen on the second side of the buried dielectric layer.

16. The method of claim 1, wherein the buried dielectric layer corresponds to a buried oxide (BOX) layer.

17. A method comprising:
performing a thinning process from a second side of a buried dielectric layer to expose an etch enhancement layer, wherein a silicon on insulator (SOI) substrate layer is positioned between the etch enhancement layer and the buried dielectric layer, wherein the second side of the buried dielectric layer is opposite a first side of the buried dielectric layer, and wherein a first semiconductor device is positioned on the first side of the buried dielectric layer;
performing an etching process to remove the etch enhancement layer; and
forming a second semiconductor device on the second side of the buried dielectric layer.

18. The method of claim 17, wherein the thinning process comprises an etching process, a grinding process, chemical mechanical planarization (CMP) process, or a combination thereof, and wherein removal of the etch enhancement layer exposes the SOI substrate layer.

19. The method of claim 17, wherein the first semiconductor device is formed on the first side of the buried dielectric layer prior to performing the thinning process.

20. The method of claim 17, further comprising attaching a handle to a dielectric layer, the dielectric layer positioned over the first semiconductor device.

21. The method of claim 20, further comprising flipping the buried dielectric layer using a mechanical arm to manipulate the handle.

22. The method of claim 17, further comprising depositing a dielectric layer on the second side of the buried dielectric layer.

23. The method of claim 17, wherein the first semiconductor device is one of a plurality of semiconductor devices on the first side of the buried dielectric layer.

24. The method of claim 17, wherein the first semiconductor device includes a transistor, a capacitor, or a diode.

25. The method of claim 17, wherein the etch enhancement layer is formed by implanting a material other than hydrogen on the second side of the buried dielectric layer.

* * * * *